United States Patent [19]
Knight

[11] 3,931,634
[45] Jan. 6, 1976

[54] JUNCTION-ISOLATED MONOLITHIC INTEGRATED CIRCUIT DEVICE WITH MEANS FOR PREVENTING PARASITIC TRANSISTOR ACTION

[75] Inventor: Mark Berwyn Knight, North Caldwell, N.J.

[73] Assignee: RCA Corporation, New York, N.Y.

[22] Filed: June 14, 1973

[21] Appl. No.: 370,051

[52] U.S. Cl. .................. 357/48; 307/202; 307/303; 357/86
[51] Int. Cl.² ........................................ H01L 27/04
[58] Field of Search ......... 317/235 E; 307/202, 303; 357/48, 86

[56] References Cited
UNITED STATES PATENTS

| | | | |
|---|---|---|---|
| 3,541,357 | 11/1970 | Kram | 307/303 |
| 3,649,887 | 3/1972 | Keller et al. | 317/235 E |
| 3,676,714 | 7/1972 | Wensink et al. | 317/235 D |
| 3,703,669 | 11/1972 | London | 317/235 E |

*Primary Examiner*—William D. Larkins
*Attorney, Agent, or Firm*—H. Christoffersen; R. P. Williams

[57] ABSTRACT

A junction-isolated monolithic integrated circuit device has its component elements connected in a circuit configuration such that at least one of the isolation PN junctions may be forward-biased at least part of the time, while other isolation junctions remain reverse-biased. To prevent detrimental parasitic transistor action which may result from the injection of carriers across a forward-biased isolation junction, means are provided for collecting those carriers at a location close to the injecting junction.

3 Claims, 3 Drawing Figures

JUNCTION-ISOLATED MONOLITHIC INTEGRATED CIRCUIT DEVICE WITH MEANS FOR PREVENTING PARASITIC TRANSISTOR ACTION

This invention relates to monolithic integrated circuit devices of the junction-isolated type.

Monolithic integrated circuit devices of this kind commonly comprise a semiconductor body including a relatively thick substrate of silicon of one type conductivity, usually P type, carrying an epitaxial layer of semiconductive material of conductivity type opposite to that of the substrate. This epitaxial layer is divided into a plurality of isolated islands, or "N-boats", by means of isolation regions of the same type conductivity as the substrate extending through the epitaxial layer so that each island of the epitaxial layer is surrounded by a PN junction. Circuit connections are made to the substrate to apply to the substrate a potential relative to the N-boats which reverse-biases the isolation PN junctions; that is, when the substrate is of P type conductivity, as is usually the case, the substrate is connected to a reference potential which is not higher than any potential which may appear in the N type material of the isolated islands during circuit operation.

Circuit conditions sometimes occur in which one or more of the isolation PN junctions may be forward-biased. When this happens, that PN junction can become the emitter junction of a parasitic transistor having the substrate or an isolation region as its base and another reverse-biased isolation PN junction as its collector junction. Minority carriers which can flow to an otherwise isolated island in this way may cause improper operation of the device.

Methods are generally known for reducing the effects of parasitic transistor action in junction-isolated integrated circuits. See Goshgarian, U.S. Pat. No. 3,430,110, for example. The problem presented and solved in Goshgarian is not, however, the problem of injection across an isolation PN junction, but instead is the problem of the substrate and isolating material being the collector of the parasitic transistor. The solution in Goshgarian is to decrease the gain of the parasitic transistor. A similar problem and solution is described in Brewer et al., U.S. Pat. No. 3,590,345.

One application in which an isolation junction in a junction-isolated monolithic integrated circuit device can become forward-biased is in the operation of the device directly from a source of AC potential without a separate DC biasing supply. The problem is that the substrate should be connected to one side of the AC line and the isolation PN junctions can therefore become forward-biased once during each cycle of operation. The patent to Keller et al., U.S. Pat. No. 3,649,887, provides one solution to this problem, that is, to interpose a diode between the substrate and one side of the AC line, with not other connections to the substrate, so that during each half-cycle when the polarity of the supply is such that the isolation junctions would be forward-biased the substrate is left floating. While this structure operates satisfactorily, the floating condition of the substrate does not provide fully effective isolation because capacitive coupling between the isolated junctions can occur. Means for preventing latching must also be provided in a device like that of Keller et al.

Kram, U.S. Pat. No. 3,541,357, describes another integrated circuit device which may be operated directly from an AC power source. The effect of temporary forward biasing of an isolation junction in Kram is minimized by inserting a resistor in series with that isolation junction to limit the current flowing across the isolation junction to a low, non-harmful level. An alternative solution is desirable.

Figure 1:
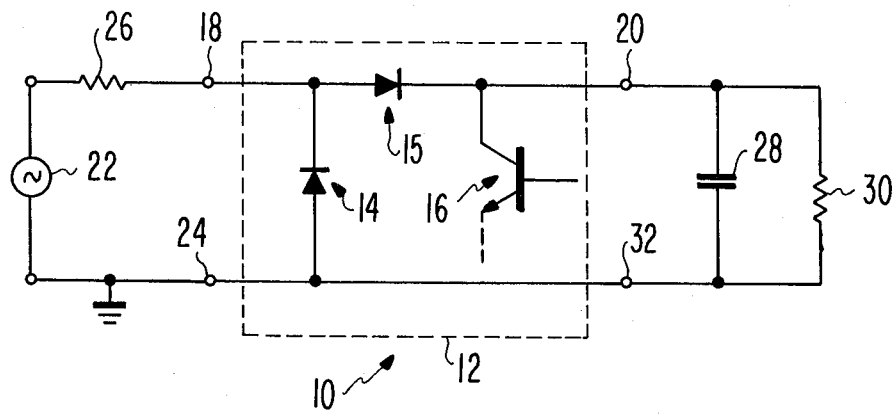
FIG. 1 is a circuit diagram including a portion of the circuitry of an integrated circuit device which may have a foward-biased isolation junction and which may have the protective means of the present invention incorporated therein.

The present integrated circuit device, indicated at 10 in the drawings, is illustrated as a device which is adapted to be operated directly from an AC source, such as a 120-volt commercial AC supply. In the present device, an isolation junction can become forward-biased as in Kram, mentioned above, but protective means different from the resistor in Kram prevent this condition from being detrimental.

A typical schematic arrangement, in which the present invention finds utility, is illustrated in FIG. 1. The on-chip components of the device 10 are enclosed within a dashed line 12 in FIG. 1. Within the dashed line 12, three components are shown, a clamping diode 14, a rectifier diode 15, and a transistor 16. The rectifier diode 15 is connected between two terminals 18 and 20 of the device 10 and serves to rectify an AC voltage, illustrated as provided by an AC supply 22 connected between the terminal 18 and a terminal 24 of the device 10. A current-limiting resistor 26 may also be used, connected between the supply 22 and the terminal 18. One side of the AC supply 22 is grounded, as is usually the case.

The clamping diode 14 is connected across the terminals 18 and 24 of the device 10 and serves, like the zener diode $D_1$ in Kram, to clamp the voltage applied to the anode of the rectifier diode 15 to a safe level. As will appear in the structural description below, the anode of the diode 14 is, in this example, the substrate material and/or an isolation region of the device 10.

The transistor 16 is included merely to illustrate the collector connection of a typical transistor located in the signal processing or other portions of the device 10. As shown, the collector of the transistor 16 is connected to the cathode of the diode 15 and to the terminal 20 of the device 10. The base and emitter connections of this transistor are not material to the present invention. An external load circuit is illustrated by a parallel combination of the capacitor 28 and a resistor 30 connected between the terminal 20 and a terminal 32 of the device 10.

The operation of the circuit of FIG. 1 is as follows. When the terminal 18 is positive with respect to the terminal 24, the rectifier diode 15 is forward-biased so that the capacitor 28 is charged to a positive voltage. The voltage is limited to the reverse-breakdown voltage of the clamping diode 14. On the negative-going half-cycle, when the terminal 18 is less positive than the terminal 24, the rectifier diode 15 is reverse-biased and the capacitor 28 is isolated from the source 22, but the clamping diode 14 is forward-biased. The voltage on the anode of the diode 14 is thus held to a value which is different from the voltage on the terminal 18 by only the small forward voltage drop through the diode 14. The energy stored in the capacitor 28 is then available as the DC collector supply for other transistors in the device 10, such as the transistor 16.

Figure 2:
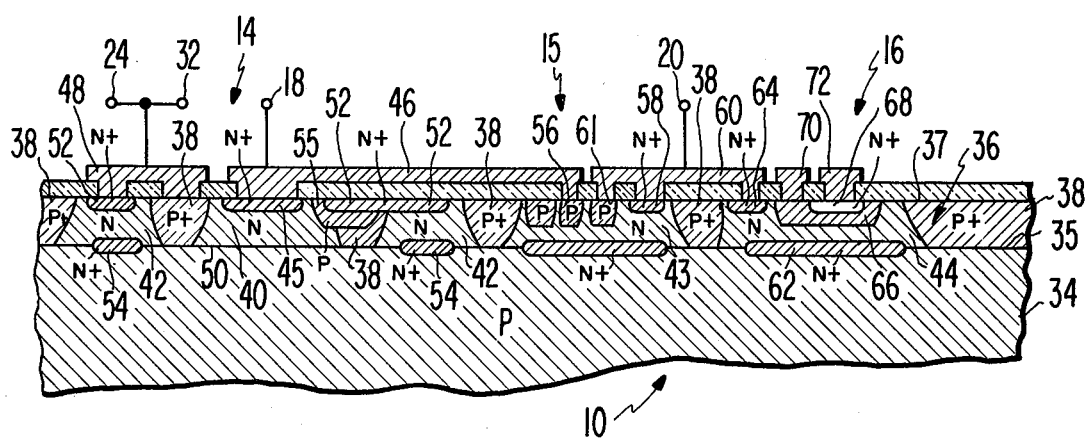
FIG. 2 is a partial cross section through an integrated circuit device illustrating a typical construction of the on-chip components of the circuits of FIG. 1.

A typical construction of the on-chip components 14, 15, and 16 of FIG. 1 is shown in FIG. 2. The device 10 comprises a substrate 34 of silicon of P type conductivity having an upper surface 35 on which is disposed an epitaxial layer 36, which is of N type conductivity throughout as it is initially formed. The epitaxial layer 36 has a thickness such that it has an upper surface 37 spaced from and parallel to the surface 35. Diffused isolation regions 38 of P+ type conductivity extend through the epitaxial layer 36 in conventional fashion to divide the epitaxial layer 36 into a plurality of separate islands, of N-boats, 40, 42, 43, and 44.

The N-boat 40 constitutes the cathode region of the diode 14, and the substrate 34 and/or the surrounding isolation region 38 together comprise its anode. The diode 14 further comprises a cathode contact region 45 which is connected to the terminal 18 of the device 10 via a deposited conductor 46. The substrate 34 is connected via the isolation region 38 surrounding the N-boat 40 and a deposited conductor 48 to the terminals 24 and 32 of the device 10. The junction 50 adjacent to the N boat 40 and separating the N-boat 40 from the substrate 34 and the surrounding isolation region 38 is thus an isolation junction which can become forward-biased when the terminals 18 and 24 are connected to an AC supply, so that minority carriers can be injected into the substrate 34.

To prevent these carriers from being collected elsewhere in the device, such as at the collector of the transistor 16, the N-boat 40 is surrounded by the N-boat 42. An N+ type contact region 52 is disposed within the N-boat 42 and is connected via the conductor 48 to the terminals 24 and 32 of the device 10. If desired, an N+ type region 54 may also be included in the substrate 34 adjacent to the N-boat 42 to lower the effective series resistance and to increase the collection efficiency of that region.

Figure 3:
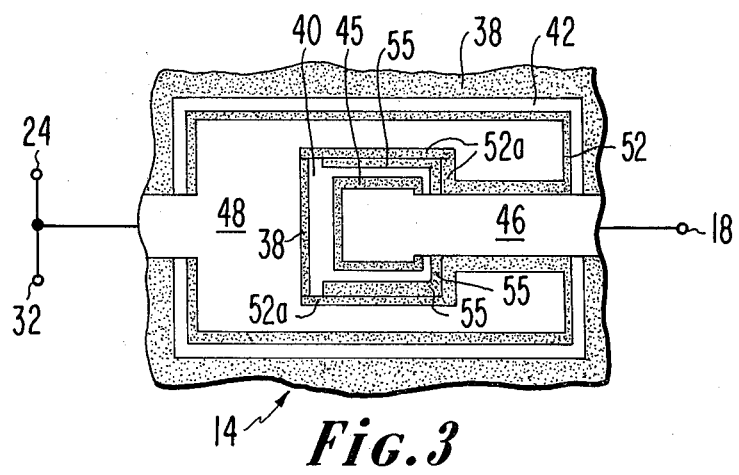
FIG. 3 is a partial plan view of one component of the integrated circuit device of FIG. 2.

Further, if desired, means may be provided for causing any injected carriers to flow laterally to the contact region 52 and thus effectively reduce the injection of carriers into the substrate 34. To this end, as shown in FIGS. 2 and 3, a region 55 of P type conductivity (lower than that of the isolation region 38) may be provided, coupled to the surrounding isolation region 38 but extending into the N-boat 40, around three sides of the N-boat 40 in this example. Moreover, at least on the same three sides, the contact region 52 may have a portion 52a thereof overlapping the region 55 and extended toward the N boat 40. Both these features improve the gain characteristics of the parasitic transistor having the N-boat 40 as its emitter, the region 55 as its base and the contact region 52 as its collector. The region 55, owing to its lower conductivity, provides a more efficiently injecting emitter junction. The extension 52a of the contact region 52 narrows the base width of the parasitic transistor. Injected carriers are thus more likely to flow directly laterally to the contact region 52. Some carriers may be injected into the substrate 34, but these should be collected directly by the surrounding protective region 42. At the fourth side of the N-boat 40 (not occupied by the region 55) the deposited conductor 48 connects the isolation region 38 around the N-boat 40 to the contact region 52 to maintain these two regions at the same potential. The cathode contact region 45 of the diode 14 is also connected by means of the deposited conductor 46 to the rectifier diode 15.

The rectifier diode 15 should have a breakdown voltage higher than the rectified voltage at the terminal 20, and to achieve this, a diode-connected PNP lateral transistor structure is used as the diode 15. The diode 15 has a P type diffused region 56 as the anode thereof and the N-boat 43 and N+ type contact region 58 as the cathode thereof. The anode region 56 is connected to the diode 14 via the conductor 46, and the cathode region 43 (and 58) is connected to the terminal 20 of the device 10 and to the transistor 16 via a deposited conductor 60. An annular region 61, the collector when this structure is connected as a transistor, is shorted to the region 58 by the conductor 60.

The transistor 16 is conventionally constructed and includes a buried N+ region 62 and the N-boat 44 as the collector thereof. An N+ region 64 serves as a collector contact region, and the conductor 60 extending from the rectifier diode 15 is connected to the region 64. The base of the transistor 16 is a diffused P type region 66, and the emitter is a diffused N+ type region 88. Deposited metal conductors 70 and 72 serve to connect the base and emitter regions 66 and 68, respectively, to other parts of the circuit.

In the operation of the device 10 from an AC source, as described above, and with a capacitive load, all of the N-boats in the several transistors in the device which are like the transistor 16 are all connected to the terminal 20 and are therefore maintained at the potential on the positive plate of the capacitor 28 or at a lower potential depending on the condition of the loads (not shown) in the collector circuits of the transistor. This potential is not lower than that on the substrate 34, so that the isolation junctions surrounding each of these N-boats are always reverse-biased. The N-boat 40, however, is connected directly to one of the input terminals 18 and will therefore be at a lower potential than the substrate region 34, which is connected directly to the other input terminal, once during each cycle of the supply, i.e., the junction 50 is forward-biased during each half-cycle of the supply. Consequently, during each half-cycle, carriers constituting minority carriers in the substrate 34 will be injected across the junction 50. Owing to the presence of the protective means of the present device, i.e., the surrounding region 42 which is also connected to the terminal 24, and, if desired, the region 55 and the extension 52a of the contact region 52, these minority carriers will be swept into the N boat 42 and the contact region 52 and thus will be collected at a location close to the point of injection. As a result, these minority carriers do not travel to a reverse-biased isolation junction elsewhere on the circuit, e.g., the junction around the transistor 16, where they might be collected and cause undesired operation of the circuit. A surrounding region like the region 42 may be provided around any N-boat which is likely to be forward biased at least momentarily.

It will thus be apparent that an arrangement is provided in which a junction-isolated device may be operated directly from an AC supply, for example, without danger of undesired operating characteristics; and in which, unlike the Keller et al. structure, the substrate may be connected to ground and thus does not float. Moreover, an alternative solution to the resistor in the Kram structure is provided.

What is claimed is:
1. A monolithic integrated circuit device comprising
   a substrate of semiconductor material of one type conductivity,
   a plurality of islands of semiconductive material of conductivity type opposite to that of said substrate on said substrate and separated from each other by intermediate isolation regions of semiconductive material of said one type conductivity,
   circuit connections within said device, said connections being such that the PN junction between at least one of said islands and said substrate and said isolation region is at least sometimes forward biased while the PN junctions between other islands and said substrate and isolation regions remain reverse biased,
   means for collecting carriers injected into said substrate and isolation regions from said at least one island at a location close to the place of injection, whereby said carriers do not travel to one or more of said reverse-biased junctions,
   said means for collecting carriers comprising a zone of said opposite type conductivity surrounding said at least one of said islands and separated therefrom by an isolation region of said one type conductivity,
   said device further comprising conductive means for connecting said carrier collecting zone to said isolation region, and
   means including a region of relatively high conductivity of said opposite type conductivity in said substrate adjacent to said carrier collecting zone for reducing the effective resistance and increasing the collection efficiency of said zone.
2. A monolithic integrated circuit device as defined in claim 1, further comprising means for effectively reducing the injection of carriers into the substrate 34.
3. A monolithic integrated circuit device as defined in claim 2, wherein said means for effectively reducing the injection of carriers into the substrate comprises:
   a region of said one type conductivity, and of lower conductivity than that of said isolation region, coupled to said isolation region and extending into said at least one island,
   said conductive means for connecting said carrier-collecting zone to said isolation region including a highly conductive region of said opposite type conductivity in said carrier-collecting zone, a portion of said highly conductive region overlapping said region of lower one type conductivity.

* * * * *